United States Patent [19]

Naka et al.

[11] Patent Number: 5,334,674
[45] Date of Patent: Aug. 2, 1994

[54] POLYHYDROXY AROMATIC COMPOUNDS, EPOXY RESINS DERIVED THEREFROM AND EPOXY RESIN COMPOSITIONS

[75] Inventors: Akihiro Naka; Shuichi Ito, both of Kyoto; Shinya Akizuki, Osaka; Kiyoshi Saito, Hyogo, all of Japan

[73] Assignees: Dai-Ichi Kogyo Seiyaku Co., Ltd., Kyoto; Nitto Denko Corporation, Osaka, both of Japan

[21] Appl. No.: 900,887

[22] Filed: Jun. 18, 1992

[30] Foreign Application Priority Data

Jun. 19, 1991 [JP] Japan .................. 3-147639
Jun. 21, 1991 [JP] Japan .................. 3-150546
Nov. 8, 1991 [JP] Japan .................. 3-293251

[51] Int. Cl.$^5$ .............. C08G 14/04; C08G 59/62; C08L 61/34; C08L 63/00; C08L 63/02; C08L 63/04

[52] U.S. Cl. .............. 525/481; 525/485; 525/486; 528/97; 528/153; 528/160

[58] Field of Search .............. 525/481, 485, 486, 488; 528/97, 153, 160, 98

[56] References Cited

U.S. PATENT DOCUMENTS

| | | | |
|---|---|---|---|
| 2,568,313 | 9/1951 | Woolhouse | 528/242 |
| 3,406,132 | 10/1968 | Winegartner | 528/160 |
| 3,535,185 | 10/1970 | Tveter | 528/160 |
| 5,068,293 | 11/1991 | Kaji | 525/534 |
| 5,162,400 | 11/1992 | Shiobara | 525/481 |
| 5,166,228 | 11/1992 | Shiobara | 525/481 |

FOREIGN PATENT DOCUMENTS

| | | |
|---|---|---|
| 942595 | 9/1951 | Fed. Rep. of Germany . |
| 1256825 | 12/1967 | Fed. Rep. of Germany . |
| 1257787 | 1/1968 | Fed. Rep. of Germany . |
| 3-717 | 1/1991 | Japan . |

*Primary Examiner*—John C. Bleutge
*Assistant Examiner*—D. R. Wilson
*Attorney, Agent, or Firm*—Jordan and Hamburg

[57] ABSTRACT

Copolycondensation of a hydroxyl group-containing naphthalene and xylene with an aldehyde compound gives a polyhydroxy aromatic compound. The hydroxyl group-containing naphthalene comprises at least one of naphthols and dihydroxynaphthalenes. In the polyhydroxy aromatic compound, the proportions of the naphthalene unit and xylene unit are 95 to 50:5 to 50 (mole percent), and each molecule contains 2 to 20 naphthalene units. The polyhydroxy aromatic compound is useful as an epoxy resin curing agent. Reaction of the polyhydroxy aromatic compound with an epihalohydrin gives an epoxy resin. An epoxy resin composition can be prepared from the epoxy resin and a curing agent. The epoxy resin composition suited for use as an IC encapsulant gives a cured product having a high glass transition temperature, high heat stability, high mechanical strength, and low moisture absorbing ability, hence good moisture resistance, owing to the presence of xylene in its molecular skeleton, thus cracking is avoided even during soldering treatment. The composition is therefore suitable as an IC encapsulant.

9 Claims, No Drawings

POLYHYDROXY AROMATIC COMPOUNDS, EPOXY RESINS DERIVED THEREFROM AND EPOXY RESIN COMPOSITIONS

BACKGROUND OF THE INVENTION

The present invention relates to epoxy resins useful, for example, as a semiconductor encapsulant, epoxy resin compositions containing said epoxy resins, and a polyhydroxy aromatic compound (polymer having hydroxy groups and aromatic rings; hereinafter referred to as "polyhydroxy aromatic compound") useful as curing agents for epoxy resins.

To protect semiconductor elements against the external environment, it is common practice to encapsulate them with an epoxy resin composition. This composition generally comprises an epoxy resin, a curing agent, a curing accelerator or promoter, a filler and several additives. The epoxy resin is an epoxidized version of a novolac resin which is obtainable by reacting a phenolic compound with formaldehyde and is typically an epoxidized o-cresol novolac. As the curing agent, phenol-formaldehyde novolac resin is typically employed. Further, as highly efficient curing agents, novolac resin obtained by reacting α-naphthol with aldehyde compounds, and epoxy resin derived from said novolac resin are known. But they have rather high softening points and fusion viscosities to be subjected to further processes such as molding, hence have not been put to practical use.

The increasing density and size of semiconductor elements and the implementation of multi-pin flat packages in recent years are tending to reduce the amount of epoxy resin relative to the encapsulated semiconductor element. As a consequence, the semiconductor is more likely to be exposed to large stresses in the encapsulating operation. Moreover, as the surface-mounting method involves dipping of the encapsulated semiconductor in a molten solder bath, the semiconductor is not only subjected to intense thermal stresses but exposed to the adverse environment that the water within the resin is rapidly vaporized to cause an expansion of resin volume.

When a large capacity semiconductor is encapsulated with the above epoxy resin, the problem of a cracked package may occur, causing deformation or corrosive breakage of the bonding wire and cracking of the passivation film of the element. Therefore, several high-performance epoxy resins have heretofore been proposed but none have overcome the problems.

It is an object of the present invention to provide a polyhydroxy aromatic compound which is of use as a curing agent for epoxy resin or an epoxy resin precursor and capable of providing a cured body which has a high glass transition temperature and improved heat and moisture resistance and is able to prevent cracking of a semiconductor package.

It is another object of the invention to provide a novel epoxy resin composition and an epoxy resin, which have a high glass transition temperature and improved heat and moisture resistance and are adapted to prevent cracking of a semiconductor package.

It is still another object of the invention to provide an epoxy resin composition and an epoxy resin, which are of use as a semiconductor encapsulant.

SUMMARY OF THE INVENTION

As a result of intensive investigations made by the present inventors in an attempt to accomplish the above objects, it was found (1) that a polyhydroxy aromatic compound obtained by the reaction of a hydroxyl group-containing naphthalene and xylene with an aldehyde compound is suited for use as an epoxy resin curing agent and as an epoxy resin precursor and (2) that an epoxy resin obtained by the reaction of said polyhydroxy aromatic compound with an epihalohydrin shows excellent performance characteristics. Based on these and other findings, the present invention has now been completed.

The present invention thus provides a polyhydroxy aromatic compound derived from a hydroxyl group-containing naphthalene and xylene by copolycondensation with an aldehyde compound and capable of serving as an epoxy resin curing agent or as an epoxy resin precursor.

The polyhydroxy aromatic compound mentioned above is useful as a curing agent for epoxy resins. Thus the invention also provides an epoxy resin composition which comprises an epoxy resin and the above polyhydroxy aromatic compound.

The polyhydroxy aromatic compound mentioned above is also useful as a precursor of epoxy resins. Thus the invention further provides a polyfunctional epoxy resin produced by reacting an epihalohydrin with a polyhydroxy aromatic compound derived from a hydroxyl group-containing naphthalene and xylene by copolycondensation with an aldehyde compound.

Still further, the invention provides an epoxy resin composition which comprises the above-mentioned epoxy resin and a curing agent.

The epoxy resin composition of the invention which contains the polyhydroxy aromatic compound as a curing agent and the epoxy resin composition of the invention which contains the polyhydroxy aromatic compound-derived epoxy resins preferably comprise a curing promoter. In that case, the compositions are especially useful as semiconductor encapsulants.

Unless otherwise specified, the term "epoxy resin" as used herein includes, within the meaning thereof, not only high-molecular-weight epoxy compounds but also low-molecular-weight epoxy compounds.

The polyhydroxy aromatic compound according to the first aspect of the invention is useful as an epoxy resin curing agent or as an epoxy resin precursor. Said polyhydroxy aromatic compound can be produced by copolycondensation of a hydroxyl group-containing naphthalene and xylene with an aldehyde compound.

The hydroxyl group-containing naphthalene includes naphthalenes containing one or two hydroxyl groups per molecule, for example α-naphthol, β-naphthol, and dihydroxynaphthalenes such as 1,5-dihydroxynaphthalene, 1,6-dihydroxynaphthalene, 1,7-dihydroxynaphthalene, 2,6-dihydroxynaphthalene, 2,7-dihydroxynaphthalene, 1,4-dihydroxynaphthalene, 1,2-dihydroxynaphthalene, 1,3-dihydroxynaphthalene and 2,3-dihydroxynaphthalene. These compounds may be used either singly or in combination as a mixture of two or more of them.

Preferred among these hydroxyl group-containing naphthalenes are naphthols (in particular, α-naphthol, which shows high copolycondensability with xylene), 1,6-dihydroxynaphthalene, 2,7-dihydronaphthalene and 1,4-dihydroxynaphthalene. These dihydroxynaphthalenes are highly copolycondensable. In the case of naphthols, the combined use of α-naphthol and β-naphthol makes it possible to increase the degree of condensation in spite of the poor condensability of β-naphthol alone. Therefore, the combined use of α-naphthol and β-naphthol is also preferred.

Those hydroxyl group-containing naphthalenes that are preferably submitted to copolycondensation together with xylene are as follows.

(a) a-Naphthol used singly,
(b) Combination of α-naphthol and β-naphthol,
(c) A dihydroxynaphthalene used singly, and
(d) Combination of a naphthol and a dihydroxynaphthalene.

As the xylene, m-xylene, o-xylene, p-xylene, and mixtures of these may be used. Particularly preferred is m-xylene, which shows high copolycondensability. xylene resins also may be used, which are obtained by reacting these xylenes with a whole amount or a part of aldehyde compounds stated hereafter, and which have oxygens in their structure and show copolycondensability with naphthols or above-mentioned polyhydroxy aromatic compound.

In the above-mentioned polyhydroxy aromatic compound, the proportions of the naphthalene unit and xylene unit are about 95 to 50:5 to 50 (mole percent), preferably about 90 to 70:10 to 30 (mole percent).

In cases where α-naphthol and β-naphthol are combinedly used, as mentioned above under (b), the proportions of the α-naphthol unit, β-naphthol unit and xylene unit are preferably 66 to 15:66 to 15:10 to 50 (mole percent).

Further, in cases where, as mentioned above under (d), a naphthol and a dihydroxynaphthalene are used in combination, the proportions of the naphthol unit, dihydroxynaphthalene unit and xylene unit are preferably 66 to 15:66 to 15:10 to 50 (mole percent).

The above-mentioned polyhydroxy aromatic compound has a weight-average molecular weight (hereinafter referred to as "average molecular weight" or "molecular weight") of about 300 to 3,000 and an hydroxyl equivalent of about 100 to 1,000, and contains 2 to 20, preferably 2 to 6, naphthalene units per molecule.

Weight-average molecular weights are measured with a gel permeation chromatography (GPC) employing polystyrenes of known molecular weights.

Solvent: tetrahydroxyfuran
Flow rate: 0.8 ml/min
Column: G4000H, G3000H and G2000H in series, having exclusion limits of molecular weights of which are 400,000, 60,000 and 10,000 respectively
Carrier: styrene-divinylbenzene copolymer
Manufactured: Toyo Soda Mfg. Co., Ltd.

The polyhydroxy aromatic compound can be produced by cocondensing a hydroxyl group-containing naphthalene and xylene with an aldehyde compound. The aldehyde compound has a molecular weight of, preferably, not more than 300.

As the aldehyde compound, there may be mentioned, for example, aliphatic aldehydes such as formaldehyde, acetaldehyde, propionaldehyde and butylaldehyde, aromatic aldehydes such as benzaldehyde, p-hydroxybenzaldehyde and salicylaldehyde, and polyvalent aldehydes such as glyoxal and terephthaladehyde. Among these compounds, formaldehyde, benzaldehyde, p-hydroxybenzaldehyde, salicylaldehyde, glyoxal and terephthalaldehyde are preferred. These aldehyde compounds may be used either alone or in combination.

The amount of the aldehyde compound to be used may vary depending on the number of formyl groups occurring in each molecule thereof but, generally, is within the range of 0.4 to 1.0 mole per mole of the sum total of 95 to 50 mole percent of the hydroxyl group-containing naphthalene and 5 to 50 mole percent of xylene. When the aldehyde is used in a smaller amount, the copolycondensate will have a smaller molecular weight, hence give epoxy resin compositions with lower heat stability. Conversely, when the aldehyde is used in an excessively large amount, an excessively high molecular weight, hence an excessively high viscosity, will be obtained, raising a moldability problem. When the xylene unit content in the molecule is lower, epoxy resin compositions with inferior moisture resistance will be obtained. When said content is excessively high, a heat stability problem will arise. When the naphthalene unit content is smaller, the cured products will have low glass transition points while, when said content is excessively high, an excessively high viscosity will result, posing a moldability problem in the step of encapsulating.

In carrying out the reaction, it is possible to use xylene or the aldehyde compound in excess and remove a part thereof in the reaction process provided that the xylene unit introduction can be accomplished to a predetermined extent.

The copolycondensate has an average molecular weight of 300 to 3,000, preferably 400 to 1,500.

The copolycondensation reaction can be carried out in any manner as far as product polymers include naphthalene structure derived from naphthol and/or dihydroxynaphthalene, xylene structure, and binding structure derived from aidehyde.

For example, the three components are charged simultaneously and an acid or a base is singly used as a catalyst. Or the reaction may be conducted in the manner of two-step process, where a basic catalyst is first added to the reaction system and then an acid catalyst is added to it. As examples of the basic catalyst, there may be mentioned caustic soda, caustic potash, ammonia and amine, and as examples of the acid catalyst, there may be mentioned mineral acids such as sulfuric acid, hydrochloric acid, nitric acid and hydrobromic acid, sulfonic acids such as p-toluenesulfonic acid and benzenesulfonic acid, and organic acids such as oxalic acid, succinic acid and malonic acid. It is also possible to effect the reaction by heating it at an elevated temperature without using any catalyst.

The copolycondensation may be a two-step reaction, where a xylene resin is first produced by reacting xylene with a whole amount or a part of aidehyde, and after that, naphthol dihydroxynaphthalene and the remaining aldehyde if any are added to the xylene resin.

A three-step reaction may also be used, where xylene resin and aldehyde resin derived from naphthol and/or dihydroxy naphthalene are produced separately and aldehyde is added to the mixture of them, if necessary.

These two-step and three-step reactions are carried out with the catalysts above mentioned.

' The reaction may be carried out in the absence or presence of a solvent. The solvent may be any of various organic solvents inert to the reaction, for example aromatic hydrocarbons such as benzene and toluene, halogenated hydrocarbons such as chlorobenzene and dichlorobenzene, ketones such as methyl ethyl ketone and methyl isobutyl ketone, ethers such as tetrahydrofuran, aprotic polar solvents such as dimethyl sulfoxide and dimethylformamide, and mixed solvents composed of two or more of these.

The reaction temperature can suitably be selected depending on the reactants and is, for example, about 50° to 200° C. For the preferred aliphatic aldehydes, the reaction temperature is about 60° to 150° C. and, for aromatic aldehydes, the reaction temperature is about 60° to 190° C. Generally, the reaction will be complete in about 1 to 10 hours.

After completion of the reaction, the insoluble matter may be removed by washing with water, for instance, or the unreacted monomers may be removed by washing with a solvent or degasification treatment under reduced pressure, when necessary.

The polyhydroxy aromatic compound obtained in the above manner is useful as a curing agent for epoxy resins and as a precursor of epoxy resins.

When a preferred polyhydroxy aromatic compound is used as an epoxy resin curing agent, the hydroxyl group-containing naphthalene in said compound should preferably be composed of a naphthol and/or a dihydroxynaphthalene.

The epoxy resin composition according to the second aspect of the invention comprises an epoxy resin and the above-mentioned polyhydroxy aromatic compound, which functions as a curing agent.

The composition preferably also comprises a curing promoter, and in that case, is especially useful as semiconductor encapsulants.

In using the polyhydroxy aromatic compound as a curing agent for epoxy resins, it may be used either alone or combinedly with some other curing agent comprising a compound having at least two, preferably three or more phenolic hydroxyl groups per molecule. As such other curing agent, there may be mentioned, for example, conventional phenol resins produced by reacting phenol or a substituted phenol (e.g. o-cresol, p-cresol, tert-butylphenol, cumylphenol, phenylphenol) with an aldehyde compound in the presence of an acid or basic catalyst, reaction products from resorcinol and an aldehyde compound, and polyvinylphenol. Said other curing agent is used in an amount of not more than 70% by weight, preferably not more than 50% by weight, based on the whole curing agent.

The epoxy resin is not limited to any particular species but may be any of conventional epoxy resins, for example, of the hisphenol A type, phenol novolak type, and cresol novolak type. Among these resins, those having a melting point above room temperature and occurring as solids or highly viscous solutions at room temperature give good results.

As the bisphenol A type epoxy resins mentioned above, those having an epoxy equivalent of 160 to 200 and a softening point of 50° to 130° C. are generally used. As the phenol novolak type epoxy resins, those having an epoxy equivalent of 180 to 210 and a softening point of 50° to 130° C. are generally used and, as the cresol novolak type epoxy resins, those having an epoxy equivalent of 180 to 210 and a softening point of 60° to 110° C. are generally used.

The proportions of the epoxy resin and curing agent are generally such that the equivalent ratio between the epoxy groups of the epoxy resin and the phenolic hydroxyl groups of the curing agent (epoxy groups/phenolic hydroxyl groups) is within the range of 1/0.8 to 1.2, preferably 1/0.9 to 1.1. When the epoxy resin and curing agent are used in such proportions, the cured products will have good heat stability and moisture resistance.

The curing promoter is not limited to any particular species but may be any of conventional catalysts. Specific examples of the curing promoter are phosphorus compounds such as triphenylphosphine, tris-2,6-dimethoxyphenylphosphine, tri-p-tolylphosphine and triphenyl phosphite, imidazoles such as 2-methylimidazole, 2-phenylimidazole, 2-undecylimidazole, 2-heptadecylimidazole and 2-ethyl-4-methylimidazole, tertiary amines such as 2-dimethylaminomethylphenol, benzyldimethylamine and α-methylbenzyldimethylamine, and such organic bases as 1,5-diazabicyclo[4.3.0]-5-nonene, 1,4-diazabicyclo[2.2.2]octane and 1,8-diazabicyclo[5.4.0]-7-undecene.

From the heat stability and moisture resistance viewpoint, the curing promoter is preferably used, for instance, at an addition level of 0.1 to 3.0% by weight based on the whole epoxy resin composition basis.

The polyhydroxy aromatic compound mentioned above is useful also as a precursor of epoxy resins.

The polyfunctional epoxy resin according to the third aspect of the invention can be obtained by reacting an epihalohydrin with the above-mentioned polyhydroxy aromatic compound derived from a hydroxyl group-containing naphthalene and xylene by copolycondensation with an aldehyde compound.

Preferred embodiments of said epoxy resin are as mentioned above with respect to the polyhydroxy aromatic compound, namely as follows:

(1) A polyfunctional epoxy resin in which the hydroxyl group-containing naphthalene is naphthol, (2) A polyfunctional epoxy resin in which the naphthol is α-naphthol plus β-naphthol, (3) A polyfunctional epoxy resin in which the hydroxyl group-containing naphthalene is dihydroxynaphthalene, (4) A polyfunctional epoxy resin in which the hydroxyl group-containing naphthalene is naphthol plus dihydroxynaphthalene, (5) A polyfunctional epoxy resin in which the proportions of the naphthalene unit and xylene unit are 95 to 50:5 to 50 (mole percent), (6) A polyfunctional epoxy resin in which the proportions of the α-naphthol unit, β-naphthol unit and xylene unit are 66 to 15:66 to 15:10 to 50 (mole percent), (7) A polyfunctional epoxy resin in which the proportions of the naphthol unit, dihydroxynaphthalene unit, and xylene unit are 66 to 15:66 to 15:10 to 50 (mole percent), and (8) A polyfunctional epoxy resin which contains 2 to 20 naphthalene units per molecule.

The epihalohydrin is, for example, epichlorohydrin, epibromohydrin, β-methylepichlorohydrin, β-methylepibromohydrin or β-methylepiiodohydrin. Epichlorohydrin is among the preferred epihalohydrins.

The reaction of the polyhydroxy aromatic compound with the epihalohydrin can be carried out in the conventional manner, for example by either of the following two typical processes.

1) One-step process which comprises reacting the polyhydroxy aromatic compound with the epihalohydrin used in excess in the presence of an alkali metal hydroxide to thereby effect the addition and epoxy ring-forming ring closure reactions simultaneously;

2) Two-step process which comprises subjecting the polyhydroxy aromatic compound and the epihalohydrin used in excess to addition reaction in the presence of a basic catalyst and then adding an alkali metal hydroxide to thereby effect ring closure.

In the above one-step and two-step processes, the epihalohydrin is used generally in an amount of 1.3 to 20 mole equivalents, preferably 2 to 10 mole equivalents, per hydroxyl equivalent of the polyhydroxy aromatic compound. After reaction, the excess epihalohydrin can be recovered for recycling.

In the above-mentioned one-step and two-step processes, sodium hydroxide or potassium hydroxide can be used as the alkali metal hydroxide. The alkali metal hydroxide to be added to the reaction system may be in the form of a solid or in the form of an aqueous solution having a concentration of about 40 to 50% by weight. The amount of the alkali metal hydroxide is about 0.8 to 1.5 mole equivalents, preferably about. 0.9 to 1.1 mole equivalents, per hydroxyl equivalent of the polyhydroxy aromatic compound.

In the one-step process mentioned above, the reaction can be performed at a temperature of, for example, 50° to 150° C. preferably 80° to 120° C.

The basic catalyst to be used in the above two-step process includes, among others, quaternary ammonium salts such as tetramethylammonium chloride, tetramethylammonium bromide, tetraethylammonium chloride, tetraethylammonium bromide, tetrabutylammonium chloride, tetrabutylammonium bromide, triethylmethylammonium chloride, trimethylbenzylammonium chloride and triethylbenzylammonium chloride.

The basic catalyst may be used in an amount of 0.002 to 3.0 mole percent relative to the hydroxyl group of the polyhydroxy aromatic compound.

In the above-mentioned two-step process, the first-step reaction can be carried out at a temperature of, for example, 60° to 150° C., preferably 100° to 140° C.

The second-step reaction can be conducted at 20° to 150° C. preferably 60° to 120° C. The amount of the alkali metal hydroxide to be used in said second-step reaction is about 1 to 1.1 moles per mole of the halohydrin formed.

These reactions may be conducted in the absence of any solvent or in the presence of a solvent inert to the reactions. Examples of the solvent are ketones such as methyl ethyl ketone and methyl isobutyl ketone, alicyclic hydrocarbons such as cyclohexane, and aromatic hydrocarbons such as toluene, among others.

After completion of the reaction process, the polyfunctional epoxy resin of the present invention can be recovered by removing the above-mentioned catalyst and other unnecessary components by washing with water or a solvent and deaeration under reduced pressure, for instance.

The polyfunctional epoxy compound of the invention is viscous or solid at the room temperature and has a weight-average molecular weight of about 350 to 5,000, preferably about 400 to 2,000. It has an epoxy equivalent of about 130 so 1,000, preferably about 150 to 500.

Since the polyfunctional epoxy resin of the invention is derivative of the above-mentioned polyhydroxy aromatic compound, cured products thereof have a high glass transition point and is excellent in heat stability and moisture resistance. Furthermore, it gives high strength at solder reflow temperatures and has a low absorbability of moisture, and thus prevents cracking of packages. Therefore, the polyfunctional epoxy resin derived from the above-mentioned polyhydroxy aromatic compound is useful as a material of epoxy resin compositions for encapsulating semiconductors.

The epoxy resin composition according to the fourth aspect of the invention comprises the polyfunctional epoxy resin derived from the above-mentioned polyhydroxy aromatic compound, and a curing agent. The composition preferably also comprises a curing promoter, and in that case, is especially useful as semiconductor encapsulants. The polyfunctional epoxy resin may be used either alone or in combination of one or more other epoxy resins, for example of the phenol novolak type, cresol novolak type or bisphenol A type. The other epoxy resins may be used in an amount of not more than 70% by weight, preferably not more than 50% by weight, on the whole epoxy resin basis.

The curing agent mentioned above may be a compound having at least two, preferably three or more, phenolic hydroxyl groups per molecule. Specific examples include the polyhydroxy aromatic compounds mentioned above and other curing agents such as those phenol resins mentioned above as combinedly usable in the epoxy resin composition according to the second aspect of the invention. The curing agent is used in the same proportion as in the epoxy resin composition according to the second aspect of the invention.

The curing promoter or accelerator to be used in this aspect of the invention includes, in the same manner as mentioned above, phosphorus compounds, imidazoles, tertiary amines, organic bases, and so on. The amount of the curing promoter is the same as in the above-mentioned second aspect of the invention.

The epoxy resin compositions of the present invention each may contain one or more additives as required. Said additives include, among others, fillers, surface modifiers for the treatment of filler surfaces, fire retardants, mold release agents, colorants, and flexibilizers.

The fillers are not limited to any particular kind but include powdered crystalline silica, powdered fused silica, powdered quartz glass, talc, powdered calcium silicate, powdered zirconium silicate, powdered alumina, and powdered calcium carbonate, among others. Among these fillers, silica-based fillers are preferred. The filler addition level is 60 to 90% by weight, preferably 70 to 85% by weight, on the whole composition basis. At addition levels above 90% by weight, the compositions show insufficient flowability, hence can hardly be molded. At addition levels below 60% by weight, the coefficient of thermal expansion tends to increase.

The surface modifiers include silane coupling agents known in the art, and the fire retardants include antimony trioxide, antimony pentoxide, phosphates and bromides. The mold release agents include various waxes, and the colorants include carbon black and so forth. The flexibilizers include, among others, silicone resins and butadiene-acrylonitrile rubbers.

The method of preparing the epoxy resin compositions of the present invention is not limited to any particular one but may be any of the conventional methods. The conditions in encapsulating semiconductors using the resin compositions of the present invention are not particularly limited to any specific ones but may suitably be selected. In a specific example, the encapsulating conditions are as follows: 175° C., molding pressure 100 kg/cm$^2$, 3 minutes; 180° C.$\times$5 hours for postcuring. A transfer molding is usually adopted.

DETAILED DESCRIPTION OF PREFERRED EMBODIMENTS

The following examples are further illustrative of typical embodiments of the present invention but are by no means limitative of the scope of the invention.

EXAMPLE 1

Polyhydroxy Aromatic Compound 1

A reaction vessel equipped with a stirrer, reflux condenser, thermometer and nitrogen inlet was charged with 144 g of α-naphthol, 40 g of xylene, 25 g of paraformaldehyde and 0.2 g of oxalic acid, and the charge was heated at 110° C. for 8 hours with stirring in a nitrogen atmosphere. Thereafter, the reaction mixture was heated at 200° C. under reduced pressure (5 mmHg) to eliminate unreacted materials and water to give a polyhydroxy aromatic compound having a molecular weight of 780. It has a low viscosity and was easily processed further. In the examples provided hereinafter, the viscosity was measured always at 150° C.

Hydroxyl equivalent: 190; softening point: 95° C.; viscosity (150° C.): 4.5 poise (hereinafter referred to as "P").

EXAMPLE 2

Polyhydroxy Aromatic Compound 2

A polyhydroxy aromatic compound was produced in the same manner as in Example 1 except that 70 g of benzaldehyde was used in lieu of paraformaldehyde, and p-toluenesulfonic acid in lieu of oxalic acid. The product had a molecular weight of 710.

Hydroxyl equivalent: 230; softening point: 98° C.; viscosity: 6.8P

EXAMPLE 3

Polyhydroxy Aromatic Compound 3

A polyhydroxy aromatic compound was produced in the same manner as in Example 1 except that 75 g of p-hydroxybenzaldehyde was used in lieu of paraformaldehyde, and P-toluenesulfonic acid in lieu of oxalic acid. The product had a molecular weight of 820.

Hydroxyl equivalent: 175; softening point: 108° C.; viscosity: 9.5P

EXAMPLE 4

Polyhydroxy Aromatic Compound 4

A polyhydroxy aromatic compound was produced in the same manner as in Example 1 except that 72 g of α-naphthol, 72 g of β-naphthol, 40 g of xylene, 23 g of paraformaldehyde and 0.2 g of oxalic acid were charged. The product had a molecular weight of 820.

Hydroxy equivalent: 184; softening point: 92° C.; viscosity: 2.8P

EXAMPLE 5

Polyhydroxy Aromatic Compound 5

A polyhydroxy aromatic compound was produced in the same manner as in Example 4 except that 90 g of benzaldehyde was used in lieu of paraformaldehyde, and p-toluene sulfonic acid in lieu of oxalic acid. The product had a molecular weight of 730.

Hydroxyl equivalent: 235; softening point: 97° C.; viscosity: 2.1P

EXAMPLE 6

Polyhydroxy Aromatic Compound 6

A polyhydroxy aromatic compound was produced in the same manner as in Example 4 except that 98 g of p-hydroxybenzaldehyde was used in lieu of paraformaldehyde, and p-toluenesulfonic acid in lieu of oxalic acid. The product had a molecular weight of 830.

Hydroxyl equivalent: 177; softening point: viscosity: 2.8P

EXAMPLE 7

Polyhydroxy Aromatic Compound 7

A polyhydroxy aromatic compound was produced in the same manner as in Example 1 except that 160 g of 1,6-dihydroxynaphthalene, 20 g of xylene, 25 g of paraformaldehyde and 0.2 g of oxalic acid were charged. The product had a molecular weight of 820.

Hydroxyl equivalent: 115; softening point: 110° C.; viscosity: 9.6P

EXAMPLE 8

Polyhydroxy Aromatic Compound 8

A polyhydroxy aromatic compound was produced in the same manner as in Example 7 except that 160 g of 1,4-dihydroxynaphthalene was used in lieu of 1,6-dihydroxynaphthalene and that xylene was used in an amount of 40 g. The product had a molecular weight of 990.

Hydroxyl equivalent: 135; softening point 104° C.; viscosity: 5.6P

EXAMPLE 9

Polyhydroxy Aromatic Compound 9

A Polyhydroxy aromatic compound was produced in the same manner as in Example 8 except that 90 g of benzaldehyde was used in lieu of paraformaldehyde, and p-toluenesulfonic acid in lieu of oxalic acid. The product had a molecular weight of 1,110.

Hydroxyl equivalent: 180; softening point: 109° C.; viscosity: 7.9P

EXAMPLE 10

Polyhydroxy Aromatic Compound 10

A polyhydroxy aromatic compound was produced in the same manner as in Example 8 except that 105 g of p-hydroxybenzaldehyde was used in lieu of paraformaldehyde, and p-toluenesulfonic acid in lieu of oxalic acid. The product had a molecular weight of 990.

Hydroxyl equivalent: 125; softening point: 115° C.; viscosity: 8.6P

EXAMPLE 11

Polyhydroxy Aromatic Compound 11

A polyhydroxy aromatic compound was produced in the same manner as in Example 1 except that 96 g of α-naphthol, 53.7 g of 1,6-dihydroxynaphthalene, 40 g of xylene, 25 g of paraformaldehyde and 0.2 g of oxalic acid were charged. The product had a molecular weight of 1,070.

Hydroxyl equivalent: 175; softening point: 106° C.; viscosity: 6.4P

EXAMPLE 12

Polyhydroxy Aromatic Compound 12

A polyhydroxy aromatic compound was produced in the same manner as in Example 11 except that 80 g of 1,4-dihydroxynaphthalene was used in lieu of 1,6-dihydroxynaphthalene. The product had a molecular weight of 1,050.

Hydroxyl equivalent: 165; softening point: 105° C.; viscosity: 6.8P

EXAMPLE 13

Polyhydroxy Aromatic Compound 13

A polyhydroxy aromatic compound was produced in the same manner as in Example 12, except that 90 g of benzaldehyde was used in lieu of paraformaldehyde, and p-toluenesulfonic acid was used in lieu of oxalic acid. The product had a molecular weight of 1,120.

Hydroxyl equivalent: 195; softening point: 115° C.; viscosity: 8.7P

EXAMPLE 14

Polyhydroxy Aromatic Compound

A polyhydroxy aromatic compound was produced in the same manner as in Example 12 except that 105 g of p-hydroxybenzaldehyde was used in lieu of paraformaldehyde, and p-toluenesulfonic acid was used in lieu of oxalic acid. The product had a molecular weight of 1,090.

Hydroxyl equivalent: 163; softening point: 116° C.; viscosity: 8.9P

EXAMPLE 15

Polyhydroxy Aromatic Compound 15

A reaction vessel equipped with a stirrer, reflux condenser, thermometer and nitrogen inlet was charged with 144 g of α-naphthol, 40 g of xylene-formaldehyde resin, 20 g of paraformaldehyde and 0.2 g of oxalic acid, and the charge was heated at 140° C. for 3 hours with stirring in a nitrogen atmosphere. Thereafter, the reaction mixture was heated at 200° C. under reduced pressure (5 mmHg) to eliminate unreacted materials and water to give a polyhydroxy aromatic compound having a molecular weight of 870. It has a low viscosity and was easy for further processing.

Hydroxyl equivalent: 188; softening point: 80° C.; viscosity (150° C.): 1.0P

EXAMPLE 16

Polyhydroxy Aromatic Compound 16

A polyhydroxy aromatic compound was produced in the same manner as in Example 15 except that 60 g of benzaldehyde was used in lieu of paraformaldehyde, and p-toluenesulfonic acid was used in lieu of oxalic acid. The product had a molecular weight of 790.

Hydroxyl equivalent: 225; softening point: 86° C.; viscosity: 1.8P

EXAMPLE 17

Polyhydroxy Aromatic Compound 17

A polyhydroxy aromatic compound was produced in the same manner as in Example 15 except that 65 g of p-hydroxybenzaldehyde was used in lieu of paraformaldehyde, and p-toluenesulfonic acid was used in lieu of oxalic acid. The product had a molecular weight of 890.

Hydroxyl equivalent: 177; softening point: 98° C.; viscosity: 2.8P

EXAMPLE 18

Polyhydroxy Aromatic Compound 18

A polyhydroxy aromatic compound was produced in the same manner as in Example 15 except that 72 g of α-naphtol, 72 g of β-naphtol, 20 g of xylene-formaldehyde resin, 23 g of paraformaldehyde and 0.2 g of oxalic acid were charged. The product had a molecular weight of 930.

Hydroxyl equivalent: 184; softening point: 68° C.; viscosity: 0.8P

EXAMPLE 19

Polyhydroxy Aromatic Compound 19

A polyhydroxy aromatic compound was produced in the same manner as in Example 15 except that 160 g of 1,6-dihydroxynaphthalene, 20 g of xylene-formaldehyde resin, 25 g of paraformaldehyde and 0.2 g of oxalic acid were charged. The product had a molecular weight of 890.

Hydroxyl equivalent: 116; softening point: 106° C.; viscosity: 2.9P

EXAMPLE 20

Polyhydroxy Aromatic Compound 20

A reactor was charged with 144 g of α-naphthol, 15 g of paraformaldehyde and 0.1 g of sulfuric acid and the charge was heated at 140° C. to produce α-naphtholformaldehyde resin. Another reactor was charged with 40 g of xylene, 20 g of paraformaldehyde and 0.1 g of caustic soda, and the charge was heated at 130° C. to produce xylene resin. The mixture of resins thus obtained was heated at 130° C. with 0.5 g of sulfuric acid. The product had a molecular weight of 1020.

Hydroxyl equivalent: 175; softening point: 68° C.; viscosity: 0.8P

EXAMPLE 21

Polyhydroxyl Aromatic Compound 21

A polyhydroxy aromatic compound was produced in the same manner as in Example 20 except that 50 g of benzaldehyde was charged in lieu of paraformaldehyde. The product had a molecular weight of 1,090.

Hydroxyl equivalent: 215; softening point: 85° C.; viscosity: 1.3P

EXAMPLES 22 THROUGH 42 AND COMPARATIVE EXAMPLE 1

Epoxy resin compositions for encapsulating semiconductors were prepared by kneading, in a two-roll mill at a temperature of 70°–110° C., mixtures of the epoxy resins, curing agent, curing promoter and filler, each specified below, antimony trioxide, a silane coupling agent, wax and carbon black, as formulated according to the recipes shown in Table 1, Table 2 and Table 3, then cooling the resulting compositions and grinding the same.

Epoxy resins: o-Cresol novolak-based epoxy resin (epoxy equivalent: 195; softening point 85° C.); Brominated phenolic novolak-based epoxy resin (epoxy equivalent: 280; softening point: 83° C.).
  Curing agent: The polyhydroxy aromatic compound obtained in each of Examples 1 to 21, or Phenolic novolak resin (hydroxyl equivalent: 106; softening point: 80° C.).

Curing promoter: Triphenylphosphine.

Filler: Spherical silica; BF 100, Mitsubishi Metal Corporation.

The compositions obtained were molded under the following curing conditions: 175° C., 100 kg/cm², 3 minutes. The moldings were subjected to postcuring under the conditions of 180° C.×6 hours to give molded test specimens. Each package was a 80-pin quadridirectional flat package (80-pin QFP, 20×14×2 mm in size) and the die pad size was 8×8 mm.

The test specimens obtained were tested for bending strength at 200° C. (high-temperature strength), glass transition temperature, thermal expansion coefficient, and moisture absorption after 500 hours of conditioning at 85° C. and 85% RH.

The thus-obtained semiconductor devices were each subjected to a TCT test (−50° C./5 minutes to 150° C./5 minutes) and the number of cracks was recorded. In a further crack resistance test, the test specimens mentioned above were allowed to stand in a constant-temperature bath maintained at 85° C. and 85% RH for moisture absorption and then immersed in a molten solder bath at 260° C. for 10 seconds. The results obtained are shown below in Table 4 and Table 9.

TABLE 1

| | Example | | | | | | |
|---|---|---|---|---|---|---|---|
| | 22 | 23 | 24 | 25 | 26 | 27 | 28 |
| o-Cresol novolak epoxy resin | 100 | 100 | 100 | 100 | 100 | 100 | 100 |
| Brominated phenol novolak epoxy resin | 10 | 10 | 10 | 10 | 10 | 10 | 10 |
| Example 1 | 91 | — | — | — | — | — | — |
| Example 2 | — | 113 | — | — | — | — | — |
| Example 3 | — | — | 90 | — | — | — | — |
| Example 4 | — | — | — | 90 | — | — | — |
| Example 5 | — | — | — | — | 115 | — | — |
| Example 6 | — | — | — | — | — | 93 | — |
| Example 7 | — | — | — | — | — | — | 59 |
| Example 8 | — | — | — | — | — | — | — |
| Example 9 | — | — | — | — | — | — | — |
| Example 10 | — | — | — | — | — | — | — |
| Example 11 | — | — | — | — | — | — | — |
| Example 12 | — | — | — | — | — | — | — |
| Example 13 | — | — | — | — | — | — | — |
| Example 14 | — | — | — | — | — | — | — |
| Phenol novolak resin | — | — | — | — | — | — | — |

TABLE 1-continued

| | Example | | | | | | |
|---|---|---|---|---|---|---|---|
| | 22 | 23 | 24 | 25 | 26 | 27 | 28 |
| Triphenylphosphine | 5 | 5 | 5 | 5 | 5 | 5 | 5 |
| BF-100 | 712 | 777 | 708 | 708 | 780 | 705 | 618 |
| Antimony trioxide | 10 | 10 | 10 | 10 | 10 | 10 | 10 |
| Silane coupling agent | 8 | 8 | 8 | 8 | 8 | 8 | 8 |
| Wax | 2 | 2 | 2 | 2 | 2 | 2 | 2 |
| Carbon black | 5 | 5 | 5 | 5 | 5 | 5 | 5 |

TABLE 2

| | Example | | | | | | |
|---|---|---|---|---|---|---|---|
| | 29 | 30 | 31 | 32 | 33 | 34 | 35 |
| o-Cresol novolak epoxy resin | 100 | 100 | 100 | 100 | 100 | 100 | 100 |
| Brominated phenol novolak epoxy resin | 10 | 10 | 10 | 10 | 10 | 10 | 10 |
| Example 1 | — | — | — | — | — | — | — |
| Example 2 | — | — | — | — | — | — | — |
| Example 3 | — | — | — | — | — | — | — |
| Example 4 | — | — | — | — | — | — | — |
| Example 5 | — | — | — | — | — | — | — |
| Example 6 | — | — | — | — | — | — | — |
| Example 7 | — | — | — | — | — | — | — |
| Example 8 | 67 | — | — | — | — | — | — |
| Example 9 | — | 86 | — | — | — | — | — |
| Example 10 | — | — | 61 | — | — | — | — |
| Example 11 | — | — | — | 79 | — | — | — |
| Example 12 | — | — | — | — | 75 | — | — |
| Example 13 | — | — | — | — | — | 92 | — |
| Example 14 | — | — | — | — | — | — | 78 |
| Phenol novolak resin | — | — | — | — | — | — | — |
| Triphenylphosphine | 5 | 5 | 5 | 5 | 5 | 5 | 5 |
| BF-100 | 638 | 690 | 620 | 675 | 663 | 715 | 672 |
| Antimony trioxide | 10 | 10 | 10 | 10 | 10 | 10 | 10 |
| Silane coupling agent | 8 | 8 | 8 | 8 | 8 | 8 | 8 |
| Wax | 2 | 2 | 2 | 2 | 2 | 2 | 2 |
| Carbon black | 5 | 5 | 5 | 5 | 5 | 5 | 5 |

TABLE 3

| | Example | | | | | | | Comparative Example |
|---|---|---|---|---|---|---|---|---|
| | 36 | 37 | 38 | 39 | 40 | 41 | 42 | 1 |
| o-Cresol novolak epoxy resin | 100 | 100 | 100 | 100 | 100 | 100 | 100 | 100 |
| Brominated phenol novolak epoxy resin | 10 | 10 | 10 | 10 | 10 | 10 | 10 | 10 |
| Example 15 | 90 | — | — | — | — | — | — | — |
| Example 16 | — | 115 | — | — | — | — | — | — |
| Example 17 | — | — | 70 | — | — | — | — | — |
| Example 18 | — | — | — | 85 | — | — | — | — |
| Example 19 | — | — | — | — | 60 | — | — | — |
| Example 20 | — | — | — | — | — | 85 | — | — |
| Example 21 | — | — | — | — | — | — | 120 | — |
| Phenol novlak resin | — | — | — | — | — | — | — | 59 |
| Triphenylphosphine | 5 | 5 | 5 | 5 | 5 | 5 | 5 | 5 |
| BF-100 | 721 | 790 | 701 | 709 | 665 | 705 | 785 | 630 |
| Antimony trioxide | 10 | 10 | 10 | 10 | 10 | 10 | 10 | 10 |
| Silane coupling agent | 8 | 8 | 8 | 8 | 8 | 8 | 8 | 8 |
| Wax | 2 | 2 | 2 | 2 | 2 | 2 | 2 | 2 |
| Carbon black | 5 | 5 | 5 | 5 | 5 | 5 | 5 | 5 |

TABLE 4

| | Example | | | | | | |
|---|---|---|---|---|---|---|---|
| | 22 | 23 | 24 | 25 | 26 | 27 | 28 |
| Bending strength (kg/cm², 200° C.) | 3.4 | 6.5 | 7.4 | 3.6 | 6.4 | 7.5 | 7.9 |
| Glass transition temperature (°C.) | 205 | 230 | 260 | 210 | 235 | 250 | 230 |
| Thermal expansion | 1.5 | 1.6 | 1.4 | 1.5 | 1.6 | 1.4 | 1.3 |

TABLE 4-continued

|  | Example | | | | | | |
|---|---|---|---|---|---|---|---|
|  | 22 | 23 | 24 | 25 | 26 | 27 | 28 |
| coefficient ($10^{-5}$/°C.) | | | | | | | |
| Water absorption (%) | 1.2 | 1.1 | 1.9 | 1.2 | 1.1 | 2.1 | 2.3 |

TABLE 5

|  | Example | | | | | | |
|---|---|---|---|---|---|---|---|
|  | 29 | 30 | 31 | 32 | 33 | 34 | 35 |
| Bending strength (kg/cm², 200° C.) | 6.4 | 7.2 | 7.9 | 5.6 | 5.8 | 6.5 | 6.9 |
| Glass transition temperature (°C.) | 220 | 250 | 270 | 235 | 230 | 250 | 260 |
| Thermal expansion coefficient ($10^{-5}$/°C.) | 1.4 | 1.3 | 1.4 | 1.5 | 1.5 | 1.5 | 1.4 |
| Water absorption (%) | 2.1 | 2.1 | 2.4 | 1.6 | 1.6 | 1.5 | 2.1 |

TABLE 6

|  | Example | | | | | | | Comparative Example |
|---|---|---|---|---|---|---|---|---|
|  | 36 | 37 | 38 | 39 | 40 | 41 | 42 | 1 |
| Bending strength (kg/cm², 200° C.) | 6.0 | 6.8 | 7.7 | 5.9 | 9.5 | 5.8 | 6.3 | 1.1 |
| Glass transition temperature (°C.) | 206 | 250 | 265 | 215 | 260 | 210 | 245 | 164 |
| Thermal expansion coefficient ($10^{-5}$/°C.) | 1.5 | 1.6 | 1.4 | 1.5 | 1.4 | 1.5 | 1.6 | 1.6 |
| Water absorption (%) | 0.8 | 0.9 | 1.5 | 0.9 | 1.9 | 0.9 | 0.8 | 3.9 |

TABLE 7

|  |  |  | Example | | | | | | |
|---|---|---|---|---|---|---|---|---|---|
|  |  |  | 22 | 23 | 24 | 25 | 26 | 27 | 28 |
| Number of cracks found in TCT test (cracks/5 specimens) | Number of cycles | 1000 | 0/5 | 0/5 | 0/5 | 0/5 | 0/5 | 0/5 | 0/5 |
|  |  | 2000 | 0/5 | 0/5 | 0/5 | 0/5 | 0/5 | 0/5 | 0/5 |
|  |  | 3000 | 1/5 | 0/5 | 0/5 | 0/5 | 0/5 | 0/5 | 0/5 |
| Number of cracks found in crack resistance test comprising immersion in molten solder (Cracks/5 specimens) | Period of treatment for moisture absorption at 85° C./85% RH | 48 Hrs | 0/5 | 0/5 | 0/5 | 0/5 | 0/5 | 0/5 | 1/5 |
|  |  | 72 Hrs | 2/5 | 0/5 | 1/5 | 0/5 | 1/5 | 1/5 | 2/5 |
|  |  | 96 Hrs | 3/5 | 1/5 | 2/5 | 1/5 | 1/5 | 2/5 | 3/5 |

TABLE 8

|  |  |  | Example | | | | | | |
|---|---|---|---|---|---|---|---|---|---|
|  |  |  | 29 | 30 | 31 | 32 | 33 | 34 | 35 |
| Number of cracks found in TCT test (cracks/5 specimens) | Number of cycles | 1000 | 0/5 | 0/5 | 0/5 | 0/5 | 0/5 | 0/5 | 0/5 |
|  |  | 2000 | 0/5 | 0/5 | 0/5 | 0/5 | 0/5 | 0/5 | 0/5 |
|  |  | 3000 | 0/5 | 0/5 | 0/5 | 0/5 | 0/5 | 0/5 | 0/5 |
| Number of cracks found in crack resistance test comprising immersion in molten solder (Cracks/5 specimens) | Period of treatment for moisture absorption at 85° C./85% RH | 48 Hrs | 0/5 | 0/5 | 0/5 | 0/5 | 0/5 | 0/5 | 0/5 |
|  |  | 72 Hrs | 1/5 | 0/5 | 0/5 | 0/5 | 1/5 | 0/5 | 1/5 |
|  |  | 96 Hrs | 2/5 | 2/5 | 0/5 | 1/5 | 2/5 | 1/5 | 1/5 |

TABLE 9

|  |  |  | Example | | | | | | | Comparative Example |
|---|---|---|---|---|---|---|---|---|---|---|
|  |  |  | 36 | 37 | 38 | 39 | 40 | 41 | 42 | 1 |
| Number of cracks found in TCT test (cracks/5 specimens) | Number of cycles | 1000 | 0/5 | 0/5 | 0/5 | 0/5 | 0/5 | 0/5 | 0/5 | 5/5 |
|  |  | 2000 | 0/5 | 0/5 | 0/5 | 0/5 | 0/5 | 0/5 | 0/5 | 5/5 |
|  |  | 3000 | 0/5 | 0/5 | 0/5 | 0/5 | 0/5 | 0/5 | 0/5 | 5/5 |
| Number of cracks found in crack resistance test comprising immersion in molten solder (Cracks/5 specimens) | Period of treatment for moisture absorption at 85° C./85% RH | 48 Hrs | 0/5 | 0/5 | 0/5 | 0/5 | 0/5 | 0/5 | 0/5 | 5/5 |
|  |  | 72 Hrs | 0/5 | 0/5 | 0/5 | 0/5 | 0/5 | 0/5 | 0/5 | 5/5 |
|  |  | 96 Hrs | 1/5 | 0/5 | 1/5 | 0/5 | 1/5 | 0/5 | 0/5 | 5/5 |

EXAMPLE 43

Epoxy Resin 1

(1) Cocondensate production

A reaction vessel equipped with a stirrer, reflux condenser, thermometer and nitrogen inlet was charged with 144 g of α-naphthol, 20 g of xylene, 25 g of paraformaldehyde and 0.2 g of oxalic acid, and the charge was heated at 110° C. for 8 hours with stirring under a nitrogen stream. The reaction mixture was then heated at 200° C. in vacuum (5 mmHg) for the removal of unreacted materials and water.

(2) Epoxy resin production

A reaction vessel was charged with the whole amount of the copolycondensate obtained as described above, 1,500 g of epichlorohydrin and 2 g of tetrabutylammonium bromide. The charge was heated under reflux for 3 hours and then the excess epichlorohydrin was removed under reduced pressure. An equal volume, relative to the reactor contents, of toluene was added, the mixture was cooled to 60° C., a water trap was attached to the reactor, 40 g of sodium hydroxide was added, and the ring closure reaction was effected while the by-product water was continuously removed under reduced pressure (100 to 150 mmHg). The salts and unreacted alkali were removed by washing with water, and the toluene, water and other volatiles were removed under reduced pressure to give an epoxy resin. The epoxy resin obtained had a molecular weight of 960 and an epoxy equivalent of 266.

Softening point: 85° C.; viscosity: 3.5P

EXAMPLE 44

Epoxy Resin 2

An epoxy resin was produced in the same manner as in Example 43 except that xylene was used in an amount of 40 g in the copolycondensate production in Example 43 (1). The epoxy resin obtained had a molecular weight of 1,150 and an epoxy equivalent of 291.

Softening point: 78° C.; viscosity: 2.8P

EXAMPLE 45

Epoxy Resin 3

An epoxy resin was produced in the same manner as in Example 43 except that xylene was charged in an amount of 80 g and 20 g of the xylene was recovered under reduced pressure after the reaction in the copolycondensate production in Example 43 (1). The epoxy resin obtained had a molecular weight of 1,190 and an epoxy equivalent of 329.

Softening point: 69° C.; viscosity: 1.9P

EXAMPLE 46

Epoxy Resin 4

An epoxy resin was produced in the same manner as in Example 43 except that, in the copolycondensate production in Example 43 (1), xylene was used in an amount of 40 g, 90 g of benzaldehyde was used in lieu of paraformaldehyde, and p-toluenesulfonic acid was used in lieu of oxalic acid. The epoxy resin obtained had a molecular weight of 1,330 and an epoxy equivalent of 369.

Softening point: 86° C.; viscosity: 3.9P

EXAMPLE 47

Epoxy Resin 5

An epoxy resin was produced in the same manner as in Example 46 except that, in the copolycondensate production, 105 g of p-hydroxy benzaldehyde was used in lieu of benzaldehyde and the reaction was carried out at a temperature of 180° C. The epoxy resin obtained had a molecular weight of 1,350 and an epoxy equivalent of 235.

Softening point: 89° C.; viscosity: 6.5P

EXAMPLE 48

Epoxy Resin 6

An epoxy resin was produced in the same manner as in Example 46 except that, in the copolycondensate production, 25 g of glyoxal was used in lieu of benzaldehyde. The epoxy resin obtained had a molecular weight of 1,090 and an epoxy equivalent of 293.

Softening point: 75° C.; viscosity: 1.8P

EXAMPLE 49

Epoxy Resin 7

An epoxy resin was produced in the same manner as in Example 46 except that, in the copolycondensate production, 57 g of terephthalaldehyde was used in lieu of benzaldehyde. The epoxy resin obtained had a molecular weight of 990 and an epoxy equivalent of 328.

Softening point: 94° C.; viscosity: 4.5P

EXAMPLES 50 THROUGH 56 AND COMPARATIVE EXAMPLE 2

Epoxy resin compositions for encapsulating semiconductors were prepared by kneading, in a two-roll mill at a temperature of 70° to 110° C., the mixtures composed of the epoxy resins, curing agent, curing promoter and filler each specified below, antimony trioxide, a silane coupling agent, wax and carbon black in the respective proportions shown below in Table 10, then cooling the mixtures and grinding the same.

Epoxy resins: Each of the epoxy resins 1 to 7 obtained in Examples 43 to 49, respectively; o-Cresol novolak epoxy resin (epoxy equivalent: 195; softening point 85° C.); Brominated phenol novolak epoxy resin (epoxy equivalent: 280; softening point 83° C.).

Curing agent: Phenol novolak resin (hydroxyl equivalent: 106; softening point 80° C.).

Curing promoter: Triphenylphosphine.

Filler: Spherical silica (BF 100, Mitsubishi Metal Corporation).

The compositions thus obtained were molded under the conditions of 175° C. and 100 kg/cm$^2$ for 3 minutes and then postcured at 180° C. for 6 hours to give molded test specimens.

The test specimens obtained were tested for bending strength at 200° C. (high-temperature strength), glass transition temperature, thermal expansion coefficient, and moisture absorption after 500 hours of conditioning at 85° C. and 85% RH. They were also tested for heat shock resistance in the following manner.

Semiconductor elements were placed on a die bonding plate and a small-sized IC molding was prepared. Ten moldings obtained in this manner were conditioned at 85° C. and 85% RH for 72 hours and then immersed in liquefied nitrogen for 10 seconds and then in a solder bath at 260° C. for 10 seconds, and the number of cracks was recorded.

The results thus obtained are shown in Table 11.

TABLE 10

| | | | Example 50 | Example 51 | Example 52 | Example 53 | Example 54 | Example 55 | Example 56 | Comparative Example 2 |
|---|---|---|---|---|---|---|---|---|---|---|
| Epoxy resin composition (parts by weight) | Epoxy resin | Example 43 | 65.1 | | | | | | | |
| | | Example 44 | | 66.7 | | | | | | |
| | | Example 45 | | | 68.8 | | | | | |
| | | Example 46 | | | | 70.7 | | | | |
| | | Example 47 | | | | | 62.7 | | | |
| | | Example 48 | | | | | | 66.8 | | |
| | | Example 49 | | | | | | | 68.8 | |
| | | o-Cresol novolak epoxy resin | | | | | | | | 60.3 |
| | | Brominated phenol novolak epoxy resin | 6 | 6 | 6 | 6 | 6 | 6 | 6 | 6 |
| Phenol novolak resin | | | 28.9 | 27.3 | 25.2 | 23.3 | 31.3 | 27.2 | 25.2 | 33.7 |
| Triphenylphosphine | | | 2 | 2 | 2 | 2 | 2 | 2 | 2 | 2 |
| BF-100 | | | 450 | 450 | 450 | 450 | 450 | 450 | 450 | 450 |
| Other components* | | | 14 | 14 | 14 | 14 | 14 | 14 | 14 | 14 |

*Antimony trioxide 6, silane coupling agent 4, wax 1, carbon black 3.

TABLE 11

| | Example 50 | Example 51 | Example 52 | Example 53 | Example 54 | Example 55 | Example 56 | Comparative Example 2 |
|---|---|---|---|---|---|---|---|---|
| Bending strength (kg/cm$^2$, 200° C.) | 7.8 | 9.9 | 5.5 | 7.6 | 11.2 | 12.1 | 13.7 | 1.1 |
| Glass transition temperature (°C.) | 235 | 218 | 200 | 205 | 245 | 235 | 247 | 164 |
| Thermal expansion coefficient ($10^{-5}$/°C.) | 1.4 | 1.5 | 1.7 | 1.6 | 1.4 | 1.3 | 1.3 | 1.6 |
| Water absorption (%) | 2.6 | 2.2 | 1.6 | 1.8 | 2.9 | 2.3 | 1.5 | 3.9 |
| Heat shock resistance | 0 | 0 | 0 | 0 | 0 | 0 | 0 | 5 |

EXAMPLE 57

Epoxy Resin 8

(1) Cocondensate production

A reaction vessel equipped with a stirrer, reflux condenser, thermometer and nitrogen inlet was charged with 96 g of α-naphthol, 48 g of β-naphthol, 20 g of xylene, 23 g of paraformaldehyde and 0.2 g of oxalic acid, and the charge was heated at 110° C. for 8 hours with stirring under a nitrogen stream. The reaction mixture was then heated at 200° C. under vacuum (5 mmHg) for removing unreacted materials and water.

(2) Epoxy resin production

A reactor was charged with the whole amount of the above copolycondensate, 1,500 g of epichlorohydrin and 2 g of tetrabutylammonium bromide, and the charge was heated under reflux for 3 hours. Then, the excess epichlorohydrin was removed under reduced pressure. An equal volume, relative to the reactor contents, of toluene was added, the resultant mixture was cooled to 60° C., a water trap was attached to the reactor 40 g of caustic soda was added, and the ring closure reaction was effected while continuously removing the byproduct water at a reduced pressure of 100 to 150 mmHg. The salts and unreacted alkali were removed by washing with water, and the toluene, water and other volatiles were removed under reduced pressure to give an epoxy resin. The epoxy resin obtained had a molecular weight of 990 and an epoxy equivalent of 260.

Softening point: 78° C.; viscosity: 0.9P

EXAMPLE 58

Epoxy Resin 9

An epoxy resin was produced in the same manner as in Example 57 except that, in the copolycondensate production in Example 57 (1), α-naphthol was used in an amount of 72 g, β-naphthol in an amount of 72 g and xylene in an amount of 40 g. The epoxy resin obtained had a molecular weight of 1,180 and an epoxy equivalent of 288.

Softening point: 72° C.; viscosity: 0.8P

EXAMPLE 59

Epoxy Resin 10

An epoxy resin was produced in the same manner as in Example 57 except that, in the copolycondensate production in Example 57 (1), α-naphthol was used in an amount of 48 g, β-naphthol in an amount of 96 g and xylene in an amount of 80 g and, after the reaction, 20 g of xylene was recovered under reduced pressure. The epoxy resin obtained had a molecular weight of 1,180 and an epoxy equivalent of 321.

Softening point: 68° C.; viscosity: 0.7P

EXAMPLE 60

Epoxy Resin 11

An epoxy resin was produced in the same manner as in Example 58 except that, in the copolycondensate production in Example 58 (1), 90 g of benzaldehyde was used in lieu of paraformaldehyde, and p-toluenesulfonic acid was used in lieu of oxalic acid. The epoxy resin obtained had a molecular weight of 1,290 and an epoxy equivalent of 365.

Softening point: 85° C.; viscosity: 0.9P

EXAMPLE 61

Epoxy Resin 12

An epoxy resin was produced in the same manner as in Example 60 except that, in the copolycondensate production in Example 60 (1), 98 g of p-hydroxybenzaldehyde was used in lieu of benzaldehyde and the reaction was carried out at a temperature of 180° C. The epoxy resin obtained had a molecular weight of 1,360 and an epoxy equivalent of 230.

Softening point: 95° C.; viscosity: 1.2P

EXAMPLE 62

Epoxy Resin 13

An epoxy resin was produced in the same manner as in Example 60 except that, in the copolycondensate production in Example 60 (1), 98 g of salicylaldehyde was used in lieu of benzaldehyde and the reaction was carried out at a temperature of 180° C. The epoxy resin obtained had a molecular weight of 1,350 and an epoxy equivalent of 240.

Softening point: 88° C.; viscosity: 0.8P

EXAMPLE 63

Epoxy Resin 14

An epoxy resin was produced in the same manner as in Example 60 except that, in the copolycondensate production in Example 60 (1), 57 g of terephthalaldehyde was used in lieu of benzaldehyde. The epoxy resin obtained had a molecular weight of 1,010 and an epoxy equivalent of 325.

Softening point: 98° C.; viscosity: 1.3P

EXAMPLES 64 THROUGH 70 AND COMPARATIVE EXAMPLE 3

Epoxy resin compositions for encapsulating semiconductors were prepared by kneading, in a two-roll mill at a temperature of 70° to 110° C. the mixtures composed of the epoxy resins, curing agent, curing promoter and filler each specified below, antimony trioxide, a silane coupling agent, wax and carbon black in the respective proportions shown below in Table 12, then cooling the mixtures and grinding the same.

Epoxy resins: Each of the epoxy resins 8 to 14 obtained in Examples 57 to 63, respectively; o-Cresol novolak epoxy resin (epoxy equivadent: 195; softening point 85° C.); Brominated phenol novolak epoxy resin (epoxy equivalent: 280; softening point 83° C.).

Curing agent: Phenol novolak resin (hydroxyl equivalent: 106; softening point 80° C.).

Curing promoter: Triphenylphosphine.

Filler: Spherical silica (BF 100, Mitsubishi Metal Corporation).

Using the resultant compositions, molded test specimens were prepared in the same manner as in Examples 50 through 56 and the test specimens obtained were tested for bending strength at 200° C. (high-temperature strength), glass transition temperature, thermal expansion coefficient, water absorption after 500 hours of conditioning at 85° C. and 85% RH, and heat shock resistance. The results obtained are shown in Table 13.

TABLE 12

| | | | Example | | | | | | | Comparative Example |
|---|---|---|---|---|---|---|---|---|---|---|
| | | | 64 | 65 | 66 | 67 | 68 | 69 | 70 | 3 |
| Epoxy resin composition (parts by weight) | Epoxy resin | Example 57 | 65.1 | | | | | | | |
| | | Example 58 | | 66.5 | | | | | | |
| | | Example 59 | | | 68.0 | | | | | |
| | | Example 60 | | | | 70.7 | | | | |
| | | Example 61 | | | | | 62.4 | | | |
| | | Example 62 | | | | | | 62.4 | | |
| | | Example 63 | | | | | | | 68.8 | |
| | | o-Cresol novolak epoxy resin | | | | | | | | 60.3 |
| | | Brominated phenol novolak epoxy resin | 6 | 6 | 6 | 6 | 6 | 6 | 6 | 6 |
| Phenol novolak resin | | | 28.9 | 27.5 | 26.0 | 23.3 | 31.6 | 31.6 | 25.2 | 33.7 |
| Triphenylphosphine | | | 2 | 2 | 2 | 2 | 2 | 2 | 2 | 2 |
| BF-100 | | | 450 | 450 | 450 | 450 | 450 | 450 | 450 | 450 |
| Other components* | | | 14 | 14 | 14 | 14 | 14 | 14 | 14 | 14 |

*Antimony trioxide 6, silane coupling agent 4, wax 1, carbon black 3.

TABLE 13

| | Example | | | | | | | Comparative Example |
|---|---|---|---|---|---|---|---|---|
| | 64 | 65 | 66 | 67 | 68 | 69 | 70 | 3 |
| Bending strength (kg/cm$^2$, 200° C.) | 8.6 | 10.4 | 6.9 | 7.5 | 11.9 | 11.9 | 13.8 | 1.1 |
| Glass transition temperature (°C.) | 255 | 240 | 225 | 230 | 265 | 265 | 270 | 164 |
| Thermal expansion coefficient ($10^{-5}$/°C.) | 1.4 | 1.4 | 1.6 | 1.5 | 1.4 | 1.4 | 1.3 | 1.6 |
| Water absorption (%) | 2.6 | 2.2 | 1.6 | 1.8 | 2.8 | 2.8 | 1.5 | 3.9 |
| Heat shock resistance | 0 | 0 | 0 | 0 | 0 | 0 | 0 | 5 |

EXAMPLE 71

Epoxy Resin 15

(1) Cocondensate production

A reaction vessel equipped with a stirrer, reflux condenser, thermometer and nitrogen inlet was charged with 160 g of 1,6-dihydroxynaphthalene, 20 g of xylene, 25 g of paraformaldehyde and 0.2 g of oxalic acid, and the charge was heated at 110° C. for 8 hours with stirring under a nitrogen stream. The reaction mixture was then heated at 200° C. under vacuum (5 mmHg) to remove unreacted materials and water.

(2) Epoxy resin production

A reactor was charged with the whole amount of the above copolycondensate, 3,000 g of epichlorohydrin and 4 g of tetrabutylammonium bromide, and the charge was heated under reflux for 3 hours. The excess epichlorohydrin was removed under reduced pressure. An equal volume of toluene was added to the reactor contents, the resultant mixture was cooled to 60° C. a water trap was attached to the reactor, 80 g of sodium hydroxide was added, and the ring closure reaction was effected while the byproduct water was continuously removed at a reduced pressure of 100 to 150 mmHg. The salts and unreacted alkali were removed by washing with water, and the toluene, water and other volatiles were then removed under reduced pressure to give an epoxy resin, which had a molecular weight of 1,120 and an epoxy equivalent of 175.

Softening point: 95° C.; viscosity: 6.6P

EXAMPLE 72

Epoxy Resin 16

An epoxy resin was produced in the same manner as in Example 71 except that, in the copolycondensate production in Example 71 (1), 1,4-dihydroxynaphthalene was used in lieu of 1,6-dihydroxynaphthalene and xylene was used in an amount of 40 g. The epoxy resin obtained had a molecular weight of 1,320 and an epoxy equivalent of 187.

Softening point: 92° C.; viscosity: 4.5P

EXAMPLE 73

Epoxy Resin 17

An epoxy resin was produced in the same manner as in Example 71 except that, in the copolycondensate production in Example 71 (1), 2,7-dihydroxynaphthalene was used in lieu of 1,6-dihydroxynaphthalene, xylene was used in an amount of 80 g and 20 g thereof recovered under reduced pressure after the reaction. The epoxy resin obtained had a molecular weight of 1,450 and an epoxy equivalent of 212.

Softening point: 91° C.; viscosity: 4.8P

EXAMPLE 74

Epoxy Resin 18

An epoxy resin was produced in the same manner as in Example 72 except that, in the copolycondensate production in Example 72 (1), 90 g of benzaldehyde was used in lieu of paraformaldehyde, and p-toluenesulfonic acid was used in lieu of oxalic acid. The epoxy resin obtained had a molecular weight of 1,460 and an epoxy equivalent of 236.

Softening point: 98° C.; viscosity: 4.3P

EXAMPLE 75

Epoxy Resin 19

An epoxy resin was produced in the same manner as in Example 74 except that, in the copolycondensate production in Example 74 (1), 105 g of p-hydroxybenzaldehyde was used in lieu of benzaldehyde and the reaction was carried out at a temperature of 180° C. The epoxy resin obtained had a molecular weight of 1,550 and an epoxy equivalent of 168.

Softening point: 105° C.; viscosity: 4.7P

EXAMPLE 76

Epoxy Resin 20

An epoxy resin was produced in the same manner as in Example 74 except that, in the copolycondensate production in Example 74 (1), 25 g of glyoxal was used in lieu of benzaldehyde. The epoxy resin obtained had a molecular weight of 1,080 and an epoxy equivalent of 175.

Softening point: 89° C.; viscosity: 4.9P

EXAMPLE 77

Epoxy Resin 21

An epoxy resin was produced in the same manner as in Example 74 except that, in the copolycondensate production in Example 74 (1), 57 g of terephthalaldehyde was used in lieu of benzaldehyde. The epoxy resin obtained had a molecular weight of 920 and an epoxy equivalent of 203.

Softening point: 105° C.; viscosity: 6.5P

EXAMPLES 78 THROUGH 84 AND COMPARATIVE EXAMPLE 4

Epoxy resin compositions for encapsulating semiconductors were prepared by kneading, in a two-roll mill at a temperature of 70° to 110° C., the mixtures composed of the epoxy resin or resins, curing agent, curing promoter and filler each specified below, antimony trioxide, a silane coupling agent, wax and carbon black in the respective proportions shown below in Table 14, then cooling the mixtures and grinding the same.

Epoxy resins: Each of the epoxy resins 15 to 21 obtained in Examples 71 to 77, respectively; o-Cresol novolak epoxy resin (epoxy equivalent: 195; softening point 85° C.); Brominated phenol novolak epoxy resin (epoxy equivalent: 280; softening point 83° C.).

Curing agent: Phenol novolak resin (hydroxyl equivalent: 106; softening point 80° C.).

Curing promoter: Triphenylphosphine.

Filler: Spherical silica (BF 100, Mitsubishi Metal Corporation).

Using the resultant compositions, molded test specimens were prepared in the same manner as in Examples 50 through 56 and the test specimens obtained were tested for bending strength at 200° C. (high-temperature strength), glass transition temperature, thermal expansion coefficient, water absorption after 500 hours of conditioning at 85° C. and 85% RH, and heat shock resistance. The results obtained are shown in Table 15.

TABLE 14

|  |  |  | Example |  |  |  |  |  |  | Comparative Example |
|---|---|---|---|---|---|---|---|---|---|---|
|  |  |  | 78 | 79 | 80 | 81 | 82 | 83 | 84 | 4 |
| Epoxy resin composition (parts by | Epoxy resin | Example 71 | 56.7 |  |  |  |  |  |  |  |
|  |  | Example 72 |  | 58.1 |  |  |  |  |  |  |
|  |  | Example 73 |  |  | 60.7 |  |  |  |  |  |
|  |  | Example 74 |  |  |  | 62.8 |  |  |  |  |
|  |  | Example 75 |  |  |  |  | 55.8 |  |  |  |
|  |  | Example 76 |  |  |  |  |  | 56.7 |  |  |

TABLE 14-continued

|  |  | Example | | | | | | | Comparative Example |
|---|---|---|---|---|---|---|---|---|---|
|  |  | 78 | 79 | 80 | 81 | 82 | 83 | 84 | 4 |
| weight) | Example 77 |  |  |  |  |  |  | 59.8 |  |
|  | o-Cresol novolak epoxy resin |  |  |  |  |  |  |  | 60.3 |
|  | Brominated phenol resin novolak epoxy | 6 | 6 | 6 | 6 | 6 | 6 | 6 | 6 |
| Phenol novolak resin |  | 37.3 | 35.9 | 33.3 | 31.2 | 38.2 | 37.3 | 34.2 | 33.7 |
| Triphenylphosphine |  | 2 | 2 | 2 | 2 | 2 | 2 | 2 | 2 |
| BF-100 |  | 450 | 450 | 450 | 450 | 450 | 450 | 450 | 450 |
| Other components* |  | 14 | 14 | 14 | 14 | 14 | 14 | 14 | 14 |

*Antimony trioxide 6, silane coupling agent 4, wax 1, carbon black 3.

TABLE 15

|  | Example | | | | | | | Comparative Example |
|---|---|---|---|---|---|---|---|---|
|  | 78 | 79 | 80 | 81 | 82 | 83 | 84 | 4 |
| Bending strength ($kg/cm^2$, 200° C.) | 8.7 | 10.9 | 7.5 | 8.5 | 12.4 | 13.1 | 14.5 | 1.1 |
| Glass transition temperature (°C.) | 255 | 235 | 220 | 225 | 265 | 255 | 269 | 164 |
| Thermal expansion coefficient ($10^{-5}$/°C.) | 1.4 | 1.4 | 1.6 | 1.5 | 1.4 | 1.3 | 1.3 | 1.6 |
| Water absorption (%) | 3.1 | 2.5 | 2.0 | 2.2 | 3.5 | 2.8 | 2.3 | 3.9 |
| Heat shock resistance | 0 | 0 | 0 | 0 | 0 | 0 | 0 | 5 |

EXAMPLE 85

Epoxy Resin 22

(1) Cocondensate production

A reaction vessel equipped with a stirrer, reflux condenser, thermometer and nitrogen inlet was charged with 96 g of α-naphthol, 53.7 g of 1,6-dihydroxynaphthalene, 20 g of xylene, 25 g of paraformaldehyde and 0.2 g of oxalic acid, and the charge was heated at 110° C. for 8 hours with stirring under a nitrogen stream. The mixture was then heated at 200° C. under vacuum (5 mmHg) for the elimination of unreacted materials and water.

(2) Epoxy resin production

A reaction vessel was charged with the whole amount of the above copolycondensate, 2,000 epichlorohydrin and 3 g of tetrabutylammonium bromide, and the charge was heated under reflux for 3 hours. The excess epichlorohydrin was then removed under reduced pressure. An equal volume of toluene was added to the reactor contents, the resultant mixture was cooled to 60° C., a water trap was attached to the reactor, 53 g of caustic soda was added, and the ring closure reaction was conducted while continuously removing the byproduct water under reduced pressure (100 to 150 mmHg). The salts and unreacted alkali were removed by washing with water, and the toluene, water and other volatiles were then removed under reduced pressure to give an epoxy resin, which had a molecular weight of 910 and an epoxy equivalent of 215.

Softening point: 91° C.; viscosity 4.4P

EXAMPLE 86

Epoxy Resin 23

An epoxy resin was produced in the same manner as in Example 85 except that, in the copolycondensate production in Example 85 (1), α-naphthol was used in an amount of 72 g, 80 g of 1,4-dihydroxynaphthalene was used in lieu of 1,6-dihydroxynaphthalene, xylene was used in an amount of 40 g and caustic soda was used in an amount of 60 g. The epoxy resin obtained had a molecular weight of 1,110 and an epoxy equivalent of 219.

Softening point: 85° C.; viscosity 3.9P

EXAMPLE 87

Epoxy Resin 24

An epoxy resin was produced in the same manner as in Example 85, except that, in the copolycondensate production in Example 85 (1), α-naphthol was used in an amount of 48 g, 107.7 g of 2,7-dihydroxynaphthalene was used in lieu of 1,6-dihydroxynaphthalene, xylene was used in an amount of 80 g, 20 g thereof was recovered after the reaction under reduced pressure, and caustic soda was used in an amount of 67 g. The epoxy resin obtained had a molecular weight of 1,250 and an epoxy equivalent of 215.

Softening point: 93° C.; viscosity: 4.5P

EXAMPLE 88

Epoxy Resin 25

An epoxy resin was produced in the same manner as in Example 86 except that, in the copolycondensate production in Example 86 (1), 90 g of benzaldehyde was used in lieu of paraformaldehyde, and p-toluenesulfonic acid was used in lieu of oxalic acid. The epoxy resin obtained had a molecular weight of 1,280 and an epoxy equivalent of 281.

Softening point: 98° C.; viscosity: 2.9P

EXAMPLE 89

Epoxy Resin 26

An epoxy resin was produced in the same manner as in Example 88 except that, in the copolycondensate production in Example 88 (1), 105 g of p-hydroxybenzaldehyde was used in lieu of benzaldehyde and the reaction was carried out at a temperature of 180° C. The epoxy resin obtained had a molecular weight of 1,390 and an epoxy equivalent of 205.

Softening point: 105° C.; viscosity: 4.2P

EXAMPLE 90

Epoxy Resin 27

An epoxy resin was produced in the same manner as in Example 88 except that, in the copolycondensate production in Example 88 (1), 25 g of glyoxal was used in lieu of benzaldehyde. The epoxy resin obtained had a molecular weight of 920 and an epoxy equivalent of 210.

Softening point. 88° C. viscosity: 3.2P

EXAMPLE 91

Epoxy Resin 28

An epoxy resin was produced in the same manner as in Example 88 except that, in the copolycondensate production in Example 88 (1), 57 g of terephthalaldehyde was used in lieu of benzaldehyde. The epoxy resin obtained had a molecular weight of 870 and an epoxy equivalent of 232.

Softening point: 95° C.; viscosity 5.5P

EXAMPLES 92 THROUGH 98 AND COMPARATIVE EXAMPLE 5

Epoxy resin compositions for encapsulating semiconductors were prepared by kneading, in a two-roll mill at a temperature of 70° to 110° C., the mixtures composed of the epoxy resin or resins, curing agent, curing promoter and filler each specified below, antimony trioxide, a silane coupling agent, wax and carbon black in the respective proportions shown below in Table 16, then cooling the mixtures and grinding the same.

Epoxy resins: Each of the epoxy resins 22 to 28 obtained in Examples 85 to 91, respectively; o-Cresol novolak epoxy resin (epoxy equivalent: 195; softening point 85° C.); Brominated phenol novolak epoxy resin (epoxy equivalent: 280; softening point: 83° C.).

Curing agent: Phenol novolak resin hydroxyl equivalent: 106; softening point 80° C.).

Curing promoter: Triphenylphosphine.

Filler: Spherical silica (BF 100, Mitsubishi Metal Corporation).

Using the resultant compositions, molded test specimens were prepared in the same manner as in Examples 50 through 56 and the test specimens obtained were tested for bending strength at 200° (high-temperature strength), glass transition temperature, thermal expansion coefficient, water absorption after 500 hours of conditioning at 85° C. and 85% RH, and heat shock resistance. The results obtained are shown in Table 17.

TABLE 16

|  |  |  | Example 92 | Example 93 | Example 94 | Example 95 | Example 96 | Example 97 | Example 98 | Comparative Example 5 |
|---|---|---|---|---|---|---|---|---|---|---|
| Epoxy resin composition (parts by weight) | Epoxy resin | Example 85 | 61.0 |  |  |  |  |  |  |  |
|  |  | Example 86 |  | 61.3 |  |  |  |  |  |  |
|  |  | Example 87 |  |  | 61.3 |  |  |  |  |  |
|  |  | Example 88 |  |  |  | 66.1 |  |  |  |  |
|  |  | Example 89 |  |  |  |  | 60.0 |  |  |  |
|  |  | Example 90 |  |  |  |  |  | 61.3 |  |  |
|  |  | Example 91 |  |  |  |  |  |  | 62.5 |  |
|  |  | o-Cresol novolak epoxy resin |  |  |  |  |  |  |  | 60.3 |
|  |  | Brominated phenol novolak epoxy resin | 6 | 6 | 6 | 6 | 6 | 6 | 6 | 6 |
| Phenol novolak resin |  |  | 33.0 | 32.7 | 32.7 | 27.9 | 34.0 | 32.7 | 31.5 | 33.7 |
| Triphenylphosphine |  |  | 2 | 2 | 2 | 2 | 2 | 2 | 2 | 2 |
| BF-100 |  |  | 450 | 450 | 450 | 450 | 450 | 450 | 450 | 450 |
| Other components* |  |  | 14 | 14 | 14 | 14 | 14 | 14 | 14 | 14 |

*Antimony trioxide 6, silane coupling agent 4, wax 1, carbon black 3.

TABLE 17

|  | Example 92 | Example 93 | Example 94 | Example 95 | Example 96 | Example 97 | Example 98 | Comparative Example 5 |
|---|---|---|---|---|---|---|---|---|
| Bending strength (kg/cm$^2$, 200° C.) | 8.5 | 10.5 | 7.1 | 8.3 | 12.2 | 12.5 | 14.2 | 1.1 |
| Glass transition temperature (°C.) | 250 | 230 | 215 | 220 | 260 | 250 | 262 | 164 |
| Thermal expansion coefficient ($10^{-5}$/°C.) | 1.4 | 1.4 | 1.6 | 1.5 | 1.4 | 1.3 | 1.3 | 1.6 |
| Water absorption (%) | 2.8 | 2.3 | 1.8 | 1.9 | 3.1 | 2.4 | 1.6 | 3.9 |
| Heat shock resistance | 0 | 0 | 0 | 0 | 0 | 0 | 0 | 5 |

EXAMPLE 99

Epoxy Resin 29

An epoxy resin was produced in the same manner as in Example 43, employing Polyhydroxyl aromatic compound 15. The product had a molecular weight of 1070 and an epoxy equivalent of 273.

Softening point (150° C.): 75° C.; viscosity: 1.9P

EXAMPLE 100

Epoxy Resin 30

An epoxy resin was produced in the same manner as in Example 43, employing Polyhydroxyl aromatic compound 16. The product had a molecular weight of 960 and an epoxy equivalent of 370.

Softening point: 82° C.; viscosity: 1.3P

EXAMPLE 101

Epoxy Resin 31

An epoxy resin was produced in the same manner as in Example 43, employing Polyhydroxyl aromatic compound 17. The product had a molecular weight of 930 and an epoxy equivalent of 235.

Softening point: 84° C.; viscosity: 2.1P

EXAMPLE 102

Epoxy Resin 32

An epoxy resin was produced in the same manner as in Example 43, employing Polyhydroxyl aromatic compound 18. The product had a molecular weight of 1,190 and an epoxy equivalent of 266.

Softening point: 75° C.; viscosity: 0.6P

EXAMPLE 103

Epoxy Resin 33

An epoxy resin was produced in the same manner as in Example 71, employing Polyhydroxyl aromatic compound 19. The product had a molecular weight of 1,010 and an epoxy equivalent of 175.

Softening point: 91° C.; viscosity: 1.9P

EXAMPLE 104

Epoxy Resin 34

An epoxy resin was produced in the same manner as in Example 43, employing Polyhydroxyl aromatic compound 20. The product had a molecular weight of 1,210 and an epoxy equivalent of 270.

Softening point: 79° C.; viscosity: 0.9P

EXAMPLE 105

Epoxy Resin 35

An epoxy resin was produced in the same manner as in Example 43, employing Polyhydroxyl aromatic compound 21. The product had a molecular weight of 1,230 and an epoxy equivalent of 365.

Softening point: 82° C.; viscosity: 0.6P

EXAMPLES 106 THROUGH 112 AND COMPARATIVE EXAMPLE 6

Epoxy resin compositions for encapsulating semiconductors were prepared by kneading, in a two-roll mill at a temperature of 70° to 110° C., the mixtures composed of the epoxy resin or resins, curing agent, curing promoter and filler each specified below, antimony trioxide, a silane coupling agent, wax and carbon black in the respective proportions shown below in Table 18, then cooling the mixtures and grinding the same.

Epoxy resins: Each of the epoxy resins 29 to 35 obtained in Examples 99 to 105, respectively; o-Cresol novolak epoxy resin (epoxy equivalent: 195; softening point: 85° C.); Brominated phenol novolak epoxy resin (epoxy equivalent: 280; softening point: 83° C.).

Curing agent: Phenol novolak resin (hydroxyl equivalent: 106; softening point: 80° C.).

Curing promoter: Triphenylphosphine.

Filler: Spherical silica (BF 100, Mitsubishi Metal Corporation).

Using the resultant compositions, molded test specimens were prepared in the same manner as in Examples 50 through 56 and the test specimens obtained were tested for bending strength at 200° (high-temperature strength), glass transition temperature, thermal expansion coefficient, water absorption after 500 hours of conditioning at 85° C. and 85% RH, and heat shock resistance. The results obtained are shown in Table 19.

TABLE 18

|  |  |  | Example |  |  |  |  |  |  | Comparative Example |
|---|---|---|---|---|---|---|---|---|---|---|
|  |  |  | 106 | 107 | 108 | 109 | 110 | 111 | 112 | 6 |
| Epoxy resin composition (parts by weight) | Epoxy resin | Example 99 | 66.7 |  |  |  |  |  |  |  |
|  |  | Example 100 |  | 70.7 |  |  |  |  |  |  |
|  |  | Example 101 |  |  | 62.7 |  |  |  |  |  |
|  |  | Example 102 |  |  |  | 65.1 |  |  |  |  |
|  |  | Example 103 |  |  |  |  | 56.7 |  |  |  |
|  |  | Example 104 |  |  |  |  |  | 66.7 |  |  |
|  |  | Example 105 |  |  |  |  |  |  | 70.7 |  |
|  |  | o-Cresol novolak epoxy resin |  |  |  |  |  |  |  | 60.3 |
|  |  | Brominated phenol novolak epoxy resin | 6 | 6 | 6 | 6 | 6 | 6 | 6 | 6 |
| Phenol novolak resin |  |  | 28.9 | 23.3 | 31.3 | 28.9 | 37.3 | 28.9 | 23.3 | 33.7 |
| Triphenylphosphine |  |  | 2 | 2 | 2 | 2 | 2 | 2 | 2 | 2 |
| BF-100 |  |  | 450 | 450 | 450 | 450 | 450 | 450 | 450 | 450 |
| Other components* |  |  | 14 | 14 | 14 | 14 | 14 | 14 | 14 | 14 |

*Antimony trioxide 6, silane coupling agent 4, wax 1, carbon black 3.

TABLE 19

|  | Example |  |  |  |  |  |  | Comparative Example |
|---|---|---|---|---|---|---|---|---|
|  | 106 | 107 | 108 | 109 | 110 | 111 | 112 | 6 |
| Bending strength (kg/cm$^2$, 200° C.) | 7.8 | 7.5 | 9.8 | 7.9 | 8.5 | 7.7 | 7.4 | 1.1 |
| Glass transition temperature (°C.) | 205 | 240 | 245 | 215 | 255 | 203 | 235 | 164 |
| Thermal expansion coefficient ($10^{-5}$/°C.) | 1.5 | 1.6 | 1.4 | 1.4 | 1.4 | 1.5 | 1.5 | 1.6 |
| Water absorption (%) | 1.8 | 1.5 | 1.9 | 1.7 | 2.1 | 1.3 | 1.1 | 3.9 |
| Heat shock resistance | 0 | 0 | 0 | 0 | 0 | 0 | 0 | 5 |

INDUSTRIAL APPLICABILITY

The xylene unit-containing polyhydroxy aromatic compound of the present invention, when used as a curing agent for epoxy resins or as an epoxy resin precursor, gives cured products having a high glass transition temperature, heat stability and moisture resistance and resistant to package cracking even during soldering treatment.

The epoxy resin of the present invention as derived from the polyhydroxy aromatic compound gives a high transition temperature of cured products, is excellent in heat stability and moisture resistance and can prevent cracking in packages.

The epoxy resin composition of the invention which contains the polyhydroxy aromatic compound as a curing agent and the epoxy resin composition of the invention which contains the epoxy resin derived from the polyhydroxy aromatic compound give a high glass transition temperature as well as excellent heat stability and high mechanical strength of semiconductor encapsulant. They show excellent moisture resistance, with low levels of water absorption, and allow only a very low frequency of cracking even in the step of soldering treatment. Therefore, they are useful as semiconductor encapsulant compositions.

Said epoxy resin composition preferably comprises a curing promoter, and in that case, are especially useful as semiconductor encapsulants.

We claim:

1. An epoxy resin composition comprising an epoxy resin and a polyhydroxy aromatic compound as an epoxy resin curing agent, said polyhydroxy aromatic compound being derived from xylene and hydroxyl group-containing naphthalene by copolycondensation with an aidehyde, the proportions of the xylene unit and the naphthalene unit being 5 to 50 and 95 to 50 mole percent respectively, the amount of said aldehyde to be used being within a range of 0.4 to 1.0 mole per mole of a sum total of the xylene and the hydroxyl group-containing naphthalene, said compound having a weight-average molecular weight of 300 to 3,000, an equivalent ratio between the epoxy groups of said epoxy resin and the phenolic hydroxyl groups of said polyhydroxy aromatic compound being within a range of 1:0.8 to 1.2.

2. An epoxy resin composition as claimed in claim 1, wherein the epoxy resin is selected from the group consisting of hisphenol A, phenol novolak and cresol novolak and has a softening point of 50° to 130° C. and an epoxy equivalent of 160 to 200.

3. An epoxy resin composition as claimed in claim 1, wherein the hydroxyl group-containing naphthalene comprises at least one of a naphthol and a dihydroxynaphthalene.

4. An epoxy resin composition for use as a semiconductor encapsulant comprising an epoxy resin, a polyhydroxy aromatic compound as an epoxy resin curing agent and a curing promoter, said polyhydroxy aromatic compound being derived from xylene and hydroxyl group-containing naphthalene by copolycondensation with an aldehyde, the proportions of the xylene unit and the naphthalene unit being 5 to 50 and 95 to 50 mole percent respectively, an amount of said aidehyde to be used being within the range of 0.4 to 1.0 mole per mole of a sum total of the xylene and the hydroxyl group-containing naphthalene, said compound having a weight-average molecular weight of 300 to 3,000, an equivalent ratio between the epoxy groups of said epoxy resin and the phenolic hydroxyl groups of said polyhydroxy aromatic compound being within a range of 1:0.8 to 1.2 and an amount of said curing promoter being up to 3.0% by weight based on the whole epoxy resin composition basis.

5. An epoxy resin composition for use as a semiconductor encapsulant as claimed in claim 4, wherein the amount of said curing promoter is within the range of 0.1 to 3.0% by weight based on the whole epoxy resin composition basis.

6. An epoxy resin composition for use as a semiconductor encapsulant as claimed in claim 4, wherein the epoxy resin is selected from the group consisting of bisphenol A, phenol novolak and cresol novolak and has a softening point of 50° to 130° C. and an epoxy equivalent of 160 to 200.

7. An epoxy resin composition for use as a semiconductor encapsulant as claimed in claim 4, wherein hydroxyl group-containing naphthalene comprises at least one of a naphthol and a dihydroxynaphthalene.

8. An epoxy resin composition for use as a semiconductor encapsulant as claimed in claim 5, wherein the epoxy resin is selected from the group consisting of hisphenol A, phenol novolak and cresol novolak and has a softening point of 50° to 130° C. and an epoxy equivalent of 160 to 200.

9. An epoxy resin composition for use as a semiconductor encapsulant as claimed in claim 5, wherein hydroxyl group-containing naphthalene comprises at least one of a naphthol and a dihydroxynaphthalene.

* * * * *